United States Patent
Kuo

(10) Patent No.: US 11,218,168 B2
(45) Date of Patent: Jan. 4, 2022

(54) METHOD AND APPARATUS FOR GENERATING AN LDPC CODE WITH A REQUIRED ERROR FLOOR

(71) Applicant: Silicon Motion, Inc., Jhubei (TW)

(72) Inventor: Shiuan-Hao Kuo, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 126 days.

(21) Appl. No.: 16/849,261

(22) Filed: Apr. 15, 2020

(65) Prior Publication Data
US 2021/0091793 A1 Mar. 25, 2021

(30) Foreign Application Priority Data
Sep. 20, 2019 (TW) ................................. 108133930

(51) Int. Cl.
| | |
|---|---|
| *H03M 13/11* | (2006.01) |
| *H03M 13/31* | (2006.01) |
| *H03M 13/09* | (2006.01) |
| *H03M 13/17* | (2006.01) |

(52) U.S. Cl.
CPC ....... *H03M 13/1157* (2013.01); *H03M 13/09* (2013.01); *H03M 13/1105* (2013.01); *H03M 13/1142* (2013.01); *H03M 13/1177* (2013.01); *H03M 13/17* (2013.01); *H03M 13/31* (2013.01)

(58) Field of Classification Search
CPC ....................... H03M 13/1157; H03M 13/1142
See application file for complete search history.

(56) References Cited

U.S. PATENT DOCUMENTS

| | | | |
|---|---|---|---|
| 8,595,589 B2 | 11/2013 | Yedidia et al. | |
| 2014/0129898 A1* | 5/2014 | Letunovskiy | ........ H03M 13/116 |
| | | | 714/755 |
| 2015/0222291 A1* | 8/2015 | Kokubun | ............ G06F 11/1068 |
| | | | 714/764 |

FOREIGN PATENT DOCUMENTS

| | | |
|---|---|---|
| CN | 107689802 A | 2/2018 |
| TW | 201011527 A1 | 3/2010 |
| WO | 2010/019169 A1 | 2/2010 |

OTHER PUBLICATIONS

Wu, Z.; "An Algorithm to Effectively Reduce Trapping Sets in Low-Density Parity-Check Codes;" Aug. 2011; pp. 1-14.

\* cited by examiner

*Primary Examiner* — Joseph D Torres
(74) *Attorney, Agent, or Firm* — McClure, Qualey & Rodack, LLP

(57) ABSTRACT

A method for generating an LDPC (low-density parity check) code with a required error floor, comprising: using a parity generation circuit to generate an LDPC code; using a detection circuit to detect the LDPC code according to a plurality of trapping set cores in a database and to generate at least one piece of trapping-set-core information; using a verification circuit to perform an important sampling simulation according to the LDPC code and each trapping-set-core information separately to obtain an estimated error floor for each trapping-set-core information; using the verification circuit to separately compare each of the estimated error floors with an expected error floor; and when all of the estimated error floors are lower than or equal to the expected error floor, using the verification circuit to output the LDPC code.

9 Claims, 6 Drawing Sheets

$$H_1 = \begin{bmatrix} A_{11} & A_{12} & A_{13} & \cdots & A_{1j} \\ A_{21} & A_{22} & A_{23} & \cdots & A_{2j} \\ \vdots & \vdots & \vdots & \ddots & \vdots \\ A_{i1} & A_{i2} & A_{i3} & \cdots & A_{ij} \end{bmatrix}$$

FIG. 3

METHOD AND APPARATUS FOR GENERATING AN LDPC CODE WITH A REQUIRED ERROR FLOOR

CROSS REFERENCE TO RELATED APPLICATIONS

This application claims priority of Taiwan Patent Application No. 108133930, filed on Sep. 20, 2019, the entirety of which is incorporated by reference herein.

BACKGROUND OF THE INVENTION

Field of the Invention

The present invention relates to an LDPC (low-density parity check) technology, and more particularly to a method and apparatus for generating an LDPC code with a required error floor.

Description of the Related Art

With the increasing demand for transmission of high-reliability data in digital communication and storage equipment systems, various error-correction techniques are widely used in these systems. In recent years, LDPC (low-density parity check) codes in particular have attracted much attention for their excellent error correction ability.

Generally, an LDPC code with a lower error floor has higher reliability. Therefore, verifying the error floor of the LDPC code is an important way to ensure reliability. However, an error floor that can be verified and obtained by a traditional verification method is not low enough. For example, an error floor verified and obtained by computer simulation is only about $10^{-6}$. Furthermore, if want to verify and obtain a much lower error floor—one that is lower than $10^{-6}$—it may take months, or even years.

BRIEF SUMMARY OF THE INVENTION

In an embodiment, a method for generating an LDPC (low-density parity check) code with a required error floor, comprising: using a parity generation circuit to generate an LDPC code; using a detection circuit to detect the LDPC code according to a plurality of trapping set cores in a database and to generate at least one piece of trapping-set-core information of the LDPC code; using a verification circuit to perform an important sampling simulation according to the LDPC code and each trapping-set-core information separately to obtain an estimated error floor for each trapping-set-core information; using the verification circuit to separately compare each of the estimated error floors with an expected error floor; and when all of the estimated error floors are lower than or equal to the expected error floor, using the verification circuit to output the LDPC code, wherein each trapping-set-core information comprises one of the trapping set cores, and an appearance number and an appearance position of it in the LDPC code, and wherein the trapping set core comprised in each trapping-set-core information are different from each other.

In an embodiment, an apparatus for generating an LDPC code with a required error floor comprises a database, a parity generation circuit, a detection circuit, and a verification circuit. The database is configured to store a plurality of trapping set cores. The parity generation circuit is configured to generate an LDPC code. The detection circuit is configured to detect the LDPC code according to a plurality of trapping set cores, and to generate at least one piece of trapping-set-core information of the LDPC code. The verification circuit is configured to perform an important sampling simulation according to the LDPC code and each trapping-set-core information separately to obtain an estimated error floor for each trapping-set-core information. The verification circuit is also configured to separately compare each of the estimated error floors with an expected error floor. When all of the estimated error floors are lower than or equal to the expected error floor, the verification circuit outputs the LDPC code, wherein each trapping-set-core information comprises one of the trapping set cores, and an appearance number and an appearance position of it in the LDPC code, and the trapping set core comprised in each trapping-set-core information are different from each other.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3 is a schematic diagram illustrating an embodiment of a parity-check matrix of an LDPC code.

DETAILED DESCRIPTION OF THE INVENTION

In order to make the above objects, features and advantages of the embodiments of the present invention easier to understand, a detailed description is given in the following embodiments with reference to the accompanying drawings.

Figure 1:
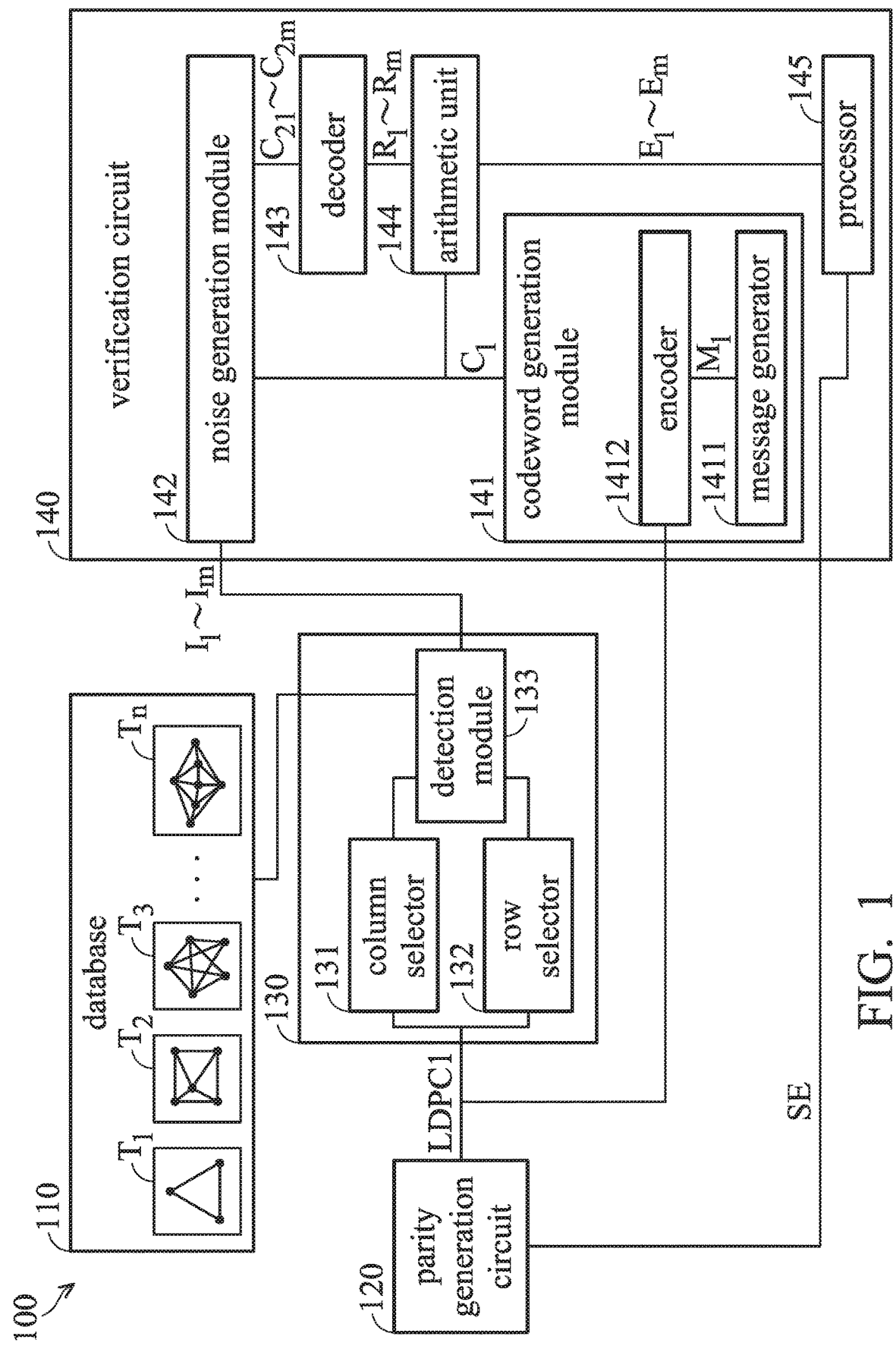
FIG. 1 is a block diagram illustrating an embodiment of an apparatus for generating an LDPC code with a required error floor.
Figure 2:
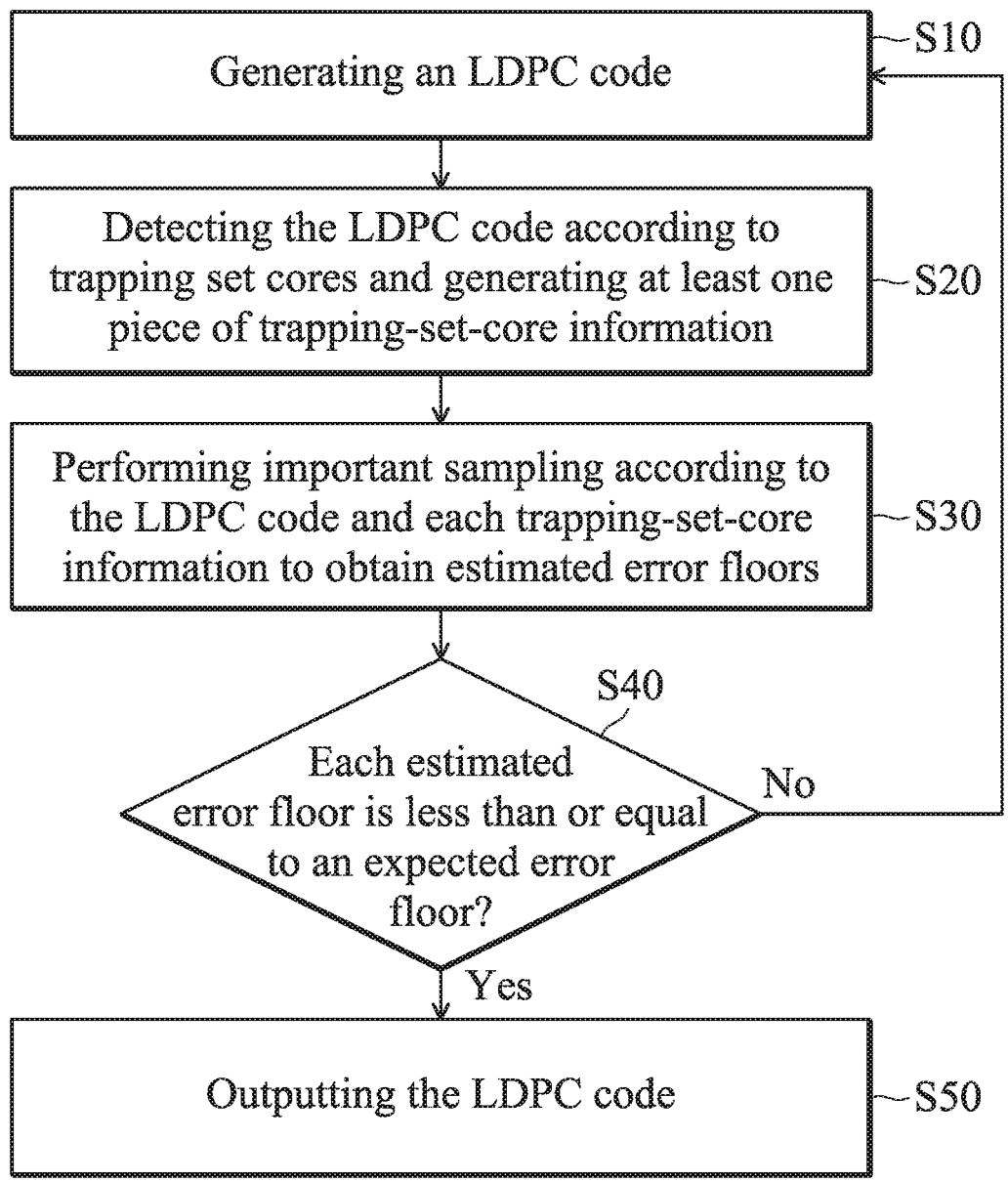
FIG. 2 is a flowchart illustrating an embodiment of a method for generating an LDPC code with a required error floor.

FIG. 1 is a block diagram illustrating an embodiment of an apparatus for generating an LDPC code with a required error floor, and FIG. 2 is a flowchart illustrating an embodiment of a method for generating an LDPC code with a required error floor. Please refer to FIG. 1 and FIG. 2. Apparatus 100 can automatically generate an LDPC (low-density parity check) code with a required error floor according to any one embodiment of generation method, so as to provide the LDPC code with high reliability for subsequent decoding or encoding.

In some embodiments, the apparatus 100 may include a database 110, a parity generation circuit 120, a detection circuit 130 and a verification circuit 140. The detection circuit 130 is coupled to the database 110 and the parity generation circuit 120, and the verification circuit 140 is coupled to the parity generation circuit 120 and the detection circuit 130.

The database 110 is configured to store a plurality of trapping set cores $T_1$-$T_n$, wherein n is a positive integer greater than 1. Furthermore, as shown in FIG. 1, the structures of these trapping set cores $T_1$-$T_n$ are different from each other, but the structures shown in FIG. 1 are not intended to limit the present invention.

In some embodiments, these trapping set cores $T_1$-$T_n$ can be separately obtained by performing a high reliability error (HRE) test on a large number of LDPC codes with known structure in advance. In some implementations, it can use a FPGA (Field Programmable Gate Array) to add high reliability errors at random positions of an LDPC code to collect its error patterns, and then determines whether the positions with high reliability errors are the trapping sets of this LDPC code. Subsequently, the trapping sets are subjected to a structure analysis to find out the largest common structures (i.e., trapping set cores), but the present invention is not limited thereto. In some implementations, a high reliability error can be formed by inverting sign bit of soft information at the random positions and changing one or more reliability bits in the soft information to "1".

In an embodiment of generation method, the apparatus 100 first can use the parity generation circuit 120 to generate an LDPC code LDPC1 (step S10). After that, the apparatus 100 can use the detection circuit 130 to detect the LDPC code LDPC1 generated in step S10 by the parity generation circuit 120 according to the trapping set cores $T_1$-$T_n$ stored in the database 110 to determine whether at least one of the trapping set cores $T_1$-$T_n$ appears in this LDPC code LDPC1, and the detection circuit 130 can generate at least one piece of trapping-set-core information $I_1$-$I_m$ related to this LDPC code LDPC1 according to the trapping set cores that have been detected (step S20), wherein m is a positive integer larger than 1 and smaller than or equal to n. Each trapping-set-core information $I_1$-$I_m$ includes one of the trapping set cores $T_1$-$T_n$, and an appearance number and an appearance position of the included trapping set core in this LDPC code LDPC1. Moreover, the trapping set core included in each trapping-set-core information $I_1$-$I_m$ are different from each other. Subsequently, the apparatus 100 can use the verification circuit 140 to separately perform an important sampling (IS) simulation according to the LDPC code LDPC1 and each trapping-set-core information $I_1$-$I_m$ obtained in step S20 to obtain estimated error floors $E_1$-$E_m$ corresponding to the trapping-set-core information $I_1$-$I_m$ (step S30). After that, the apparatus 100 can further use the verification circuit 140 to separately compare each of the estimated error floors $E_1$-$E_m$ with an expected error floor (step S40). Furthermore, when the comparison result of step S40 with all the estimated error floors $E_1$-$E_m$ are less than or equal to the expected error floor, the apparatus 100 can use the verification circuit 140 to output this LDPC code LDPC1 (step S50). From the comparison result of step S40, when any one of the estimated error floors $E_1$-$E_m$ of the trapping-set-core information $I_1$-$I_m$ is greater than the expected error floor, the apparatus 100 can return to step S10. For example, the apparatus 100 can generate an enable signal SE to the parity generation circuit 120 to generate another LDPC code for another detection.

Herein, the expected error floor can be set according to the required reliability. With a lower expected error floor, an LDPC code LDPC1 output by the apparatus 100 can have much higher reliability. Furthermore, compared to traditional techniques which require several months or even years to obtain an LDPC code with error floor low enough (e.g., $10^{-16}$ FER (or BER), $10^{-20}$ FER (or BER), etc.), any one embodiment of generation method in the present invention can obtain the LDPC code with error floor low enough faster.

In an embodiment of step S10, the parity generation circuit 120 can generate an LDPC code LDPC 1 by using the coding manner of the QC-LDPC code (Quasi-Cyclic Low Density Parity Check Code). Please refer to FIG. 3, for example, a parity-check matrix H1 of an LDPC code LDPC1 may be composed of i*j square matrices $A_{11}$-$A_{ij}$, and each of the square matrices $A_{11}$-$A_{ij}$ is a circular square matrix of size p*p, wherein i, j and p are positive integers larger than 1. Herein, each of the square matrices $A_{11}$-$A_{ij}$ can be represented by a corresponding representative number. Each representative number is less than or equal to p, and each representative number refers to the appearance position of the first "1" in the first row of each square matrix $A_{11}$-$A_{ij}$. For example, when the representative number of square matrix $A_{11}$ is 8, it means that the first "1" in the first row of square matrix $A_{11}$ appears in the eighth column. Therefore, the parity generation circuit 120 can fill the representative numbers of the square matrix $A_{11}$-$A_{ij}$ in a random manner to randomly generate the parity-check matrix of the LDPC code LDPC1. However, the present invention is not limited thereto. The parity generation circuit 120 can use any suitable coding method to generate the LDPC code LDPC1.

In an embodiment of step S20, the detection circuit 130 can scan through the LDPC code LDPC1 sequentially according to the structure pattern of each of the trapping set cores $T_1$-$T_n$, and generate corresponding trapping-set-core information $I_1$-$I_m$ based on the scanning results. Herein, the detection circuit 130 may include a column selector 131, a row selector 132 and a detection module 133. The detection module 133 is coupled to the column selector 131 and the row selector 132, as shown in FIG. 1.

Figure 4:
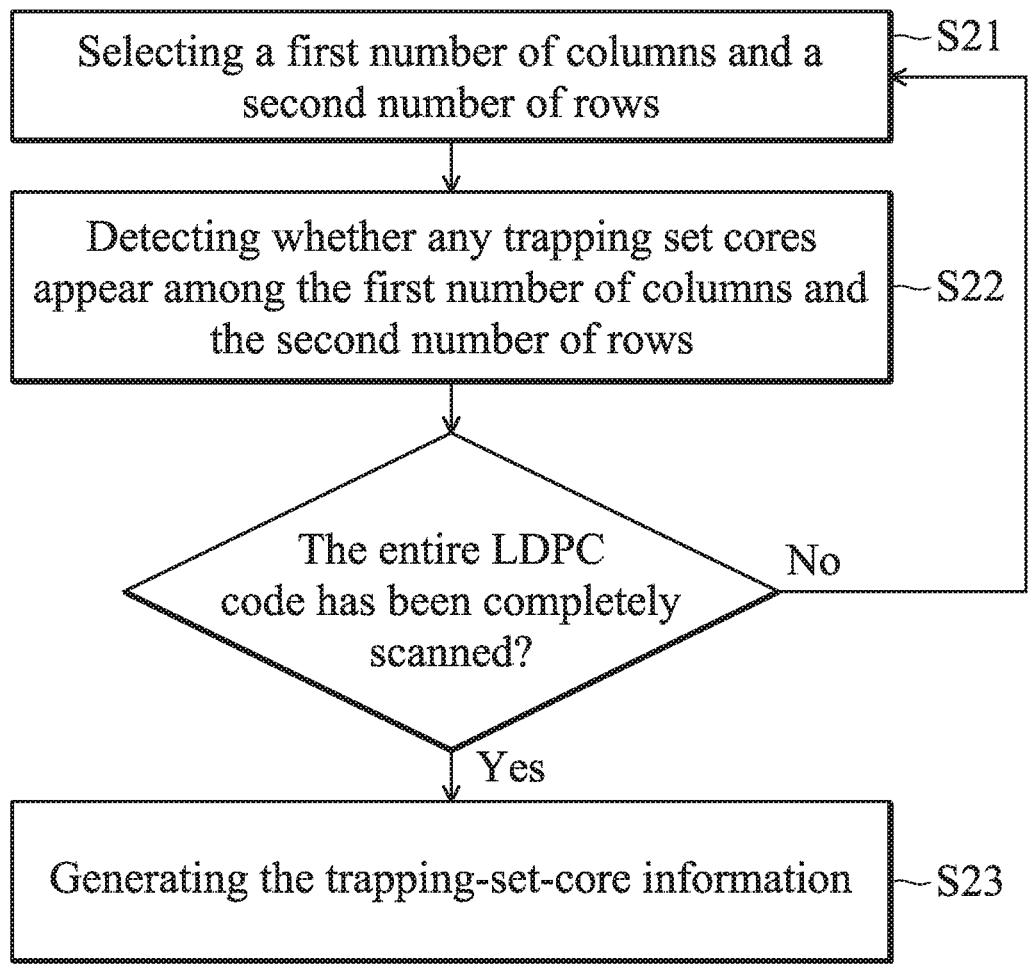
FIG. 4 is a flowchart illustrating an embodiment of step S20 in FIG. 2.

FIG. 4 is a flowchart illustrating an embodiment of step S20 in FIG. 2. Please refer to all the figures from FIG. 1 to FIG. 4. In an embodiment of step S20, the detection circuit 130 can use the column selector 131 to select a first number of columns from a plurality of columns in the LDPC code LDPC1, and use the row selector 132 to select a second number of rows from a plurality of rows in the LDPC code LDPC1 (step S21). After that, the detection circuit 130 can use the detection module 133 to detect whether any one of the trapping set cores $T_1$-$T_n$ appears among the first number of columns selected by the column selector 131 and on the second number of rows selected by the row selector 132 (step S22). Furthermore, after finish detecting the selected first number of columns and the selected second number of rows, the detection circuit 130 can determine whether the entire LDPC code LDPC1 has been scanned. If the scanning has not been completed, the method returns to step S21, so that the column selector 131 and the row selector 132 respectively reselect a first number of columns and a second number of rows, and the detection module 133 can continue to detect the first number of columns and the second number of rows that are newly selected. These steps are repeated until all the combinations of the first number of columns selected by the column selector 131 and the second number of rows selected by the row selector 132 are scanned by the detection module 133 (i.e., scanning through the entire LDPC code LDPC1), and then the detection circuit 130 can use the detection module 133 to separately generate corresponding trapping-set-core information based on each trapping set core which appears in the LDPC code LDPC1, an appearance number and an appearance position (step S23).

In an embodiment of step S21, the first number may be the same to the second number. In the following paragraphs, one embodiment in which the first number and the second number are both 3 is used for the purposes of explanation, but the values of numbers are not limited thereto. In order not to omit any combination, the column selector 131 and the row selector 132 can separately select the first number of columns and the second number of rows in a sequential manner. For example, the column selector 131 can sequentially select: the first column, the second column and the third column; the first column, the second column and the fourth column; ... ; the first column, the second column and the last column; the first column, the third column and the fourth column; the first column, the third column and the fifth column; ... ; the first column, the third column and the last column; and the selected combinations can be analogized in this manner. Similarly, the row selector 132 can sequentially select: the first row, the second row and the third row; the first row, the second row and the fourth row; ... ; the first row, the second row and the last row; the first row, the third row and the fourth row; the first row, the third row and the fifth row; ... ; the first row, the third row and the last row; and the selected combinations can be analogized in this manner. Furthermore, the detection circuit 130 can first fix the selection of the row selector 132 until the column selector 131 has scanned all the combinations of columns, the detection circuit 130 enable the row selector 132 to select another combination of rows to completely scan the entire LDPC code LDPC1.

In an embodiment of step S22, the detection module 133 can calculate according to a plurality of crossed nodes located on the first number of columns selected by the column selector 131 and the second number of rows selected by the row selector 132, and determine whether any trapping set cores $T_1$-$T_n$ appear according to the calculation result. How to confirm whether any trapping set cores $T_1$-$T_n$ appear in the LDPC code LDPC1 is a skill that is well known to those with ordinary skill in the art. Therefore, in the following paragraphs, a trapping set core $T_1$ with simplest triangular structure (as shown in FIG. 1) is used to explain how to confirm whether the trapping set cores $T_1$ appear in the LDPC code LDPC1. However, the structure pattern of this trapping set core $T_1$ is not used to limit the present invention.

Figure 5:
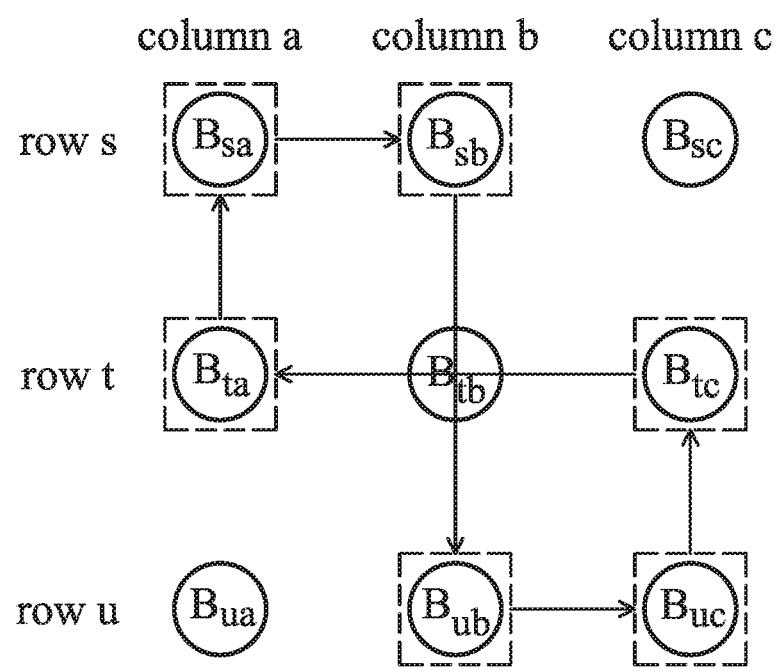
FIG. 5 is a schematic diagram illustrating an embodiment of a part of an LDPC code.

In an implementation, the detection module 133 can first select six crossed nodes from the nine crossed nodes in random. After that, the detection module 133 can start with one of the crossed nodes as starting point, sequentially go through the other five crossed nodes and return to the starting point. The detection module 133 follows this path to sequentially add up the representative number of each crossed node in an order of one positive and one negative. If the calculation result is equal to zero, it indicates that these six crossed nodes form a trapping set core $T_1$ with triangular structure. Conversely, if the calculation result is not equal to zero, it indicates that a trapping set core $T_1$ with triangular structure is not formed. For example, as shown in FIG. 5, in the columns (a, b and c) selected by the column selector 131 and the rows (s, t and u) selected by the row selector 132, there exists total nine crossed nodes ($B_{sa}$, $B_{sb}$, $B_{sc}$, $B_{ta}$, $B_{tb}$, $B_{tc}$, $B_{ua}$, $B_{ub}$ and $B_{uc}$). The detection module 133 can select the crossed nodes $B_{sa}$, $B_{sb}$, $B_{ta}$, $B_{tc}$, $B_{ub}$ and $B_{uc}$ to perform the calculation. Herein, the detection module 133 may start with the crossed node $B_{sa}$, and return to the crossed node $B_{sa}$ in the order of crossed node $B_{sb}$, crossed node $B_{ub}$, crossed node $B_{uc}$, crossed node $B_{tc}$ and crossed node $B_{ta}$ to complete a circle, and follow this circle path to generate an relationship equation in an order of one positive and one negative according to these crossed nodes. The obtained relationship equation can be represented as follows: $B_{sa}-B_{sb}+B_{ub}-B_{uc}+B_{tc}-B_{ta}$. When the calculation of this relationship equation is equal to zero, it indicates that a trapping set core $T_1$ is formed, and the detection module 133 can record the appeared trapping set core $T_1$, an appearance number of the trapping set core $T_1$ and the positions of these crossed nodes ($B_{sa}$, $B_{sb}$, $B_{ta}$, $B_{tc}$, $B_{ub}$ and $B_{uc}$) that form the trapping set core $T_1$.

In an embodiment of step S23, step S21 and step S22 are repeated until the detection module 133 has completely scanned the entire LDPC code LDPC1, and then the detection module 133 can organize according to all recorded results and generate corresponding trapping-set-core information Each trapping-set-core information $I_1$-$I_m$ includes message about type of trapping set core, and appearance number and appearance position of this type of trapping set core, etc., wherein the appearance position is the position of multiple crossed nodes constituting this trapping set core.

For example, it is assumed that the detection circuit 130 detected that there are three kinds of trapping set cores $T_1$, $T_2$, and $T_3$ exist in the LDPC code LDPC1, the detection circuit 130 can generate three corresponding trapping-set-core information $I_1$, $I_2$, and $I_3$, wherein the trapping-set-core information $I_1$ includes the trapping set cores $T_1$, and appearance number and appearance position in this LDPC code LDPC1 of the trapping set cores $T_1$. The trapping-set-core information $I_2$ includes the trapping set cores $T_2$, and appearance number and appearance position in this LDPC code LDPC1 of the trapping set cores $T_2$. The trapping-set-core information $I_3$ includes the trapping set cores $T_3$, and appearance number and appearance position in this LDPC code LDPC1 of the trapping set cores $T_3$.

In another embodiment of step S20, each of the trapping set cores $T_1$-$T_n$ has a corresponding structural formula. The detection circuit 130 can directly perform calculation on the LDPC code LDPC1 separately according to the structural formula of each of the trapping set cores $T_1$-$T_n$, and determines whether any one of the trapping set cores $T_1$-$T_n$ exists in the LDPC code LDPC1 according to each calculation result. When determining at least one of the trapping set cores $T_1$-$T_n$ exists in the LDPC code LDPC1, the detection circuit 130 generates corresponding trapping-set-core information $I_1$-$I_m$.

Figure 6:
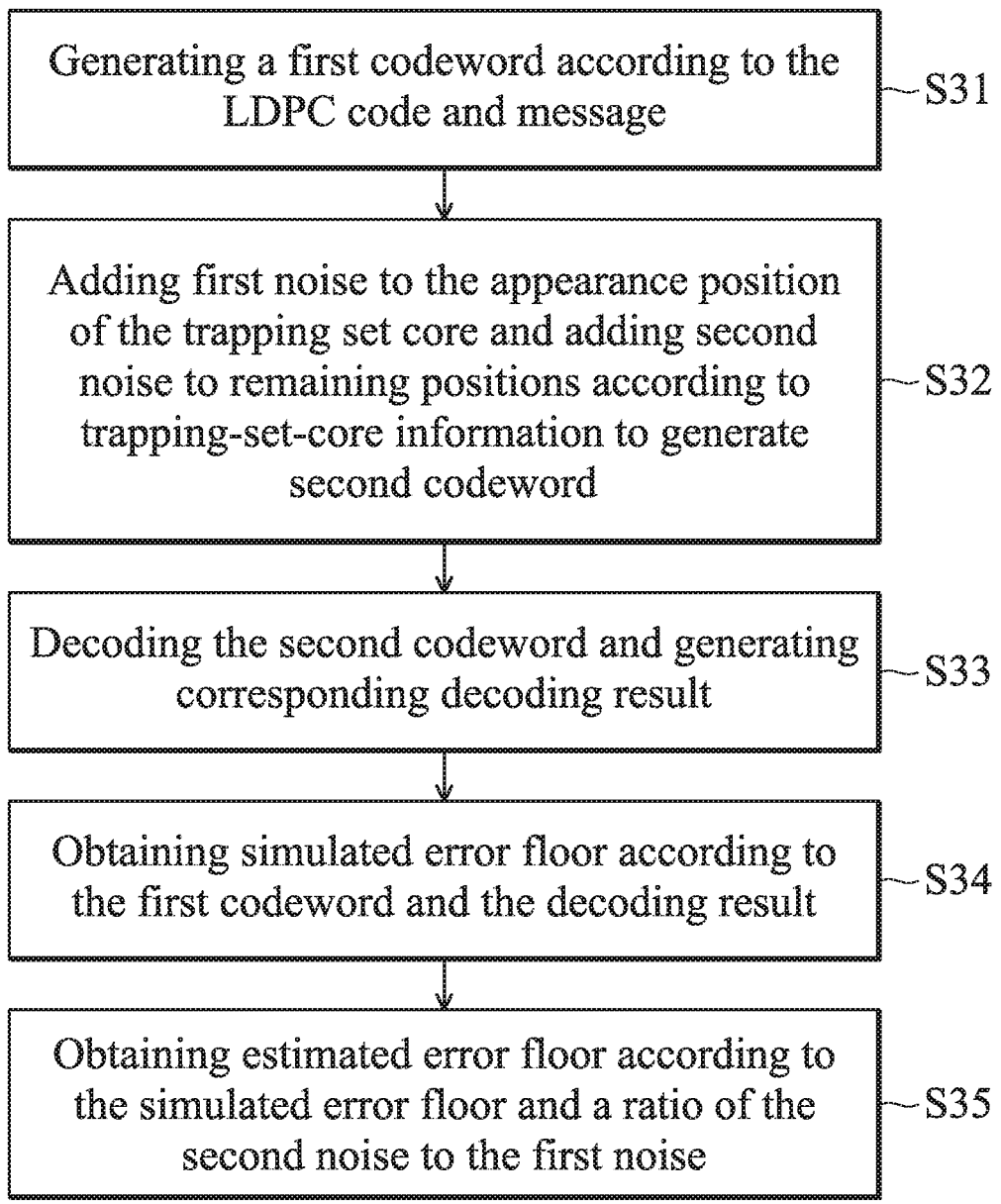
FIG. 6 is a flowchart illustrating an embodiment of step S30 in FIG. 2.

FIG. 6 is a flowchart illustrating an embodiment of step S30 in FIG. 2. Please refer to all the figures from FIG. 1 to FIG. 6. In an embodiment of step S30, the verification circuit 140 may include a codeword generation module 141, a noise generation module 142, a decoder 143, an arithmetic unit 144 and a processor 145. The noise generation module 142 is coupled to the codeword generation module 141 and the decoder 143. The arithmetic unit 144 is coupled to the codeword generation module 141, the decoder 143 and the processor 145.

Herein, the verification circuit 140 can first use the codeword generation module 141 to generate a first codeword $C_1$ according to the LDPC code LDPC1 generated by the parity generation circuit 120 and a message M1 (step S31). After that, the verification circuit 140 uses the noise generation module 142 to add first noise with a first value to the appearance position of the trapping set core in the LDPC code LDPC1 and add second noise with a second value to remaining positions in the LDPC code LDPC1 separately according to each trapping-set-core information $I_1$-$I_m$, so as to generate second codewords $C_{21}$-$C_{2m}$ corresponding to trapping-set-core information $I_1$-$I_m$ (step S32), wherein the first value is greater than the second value. Subsequently, the verification circuit 140 can use the decoder 143 to separately decode according to the second codewords $C_{21}$-$C_{2m}$ obtained in step S32, and to generate decoding results $R_1$-$R_m$ separately (step S33). After that, the verification circuit 140 can use the arithmetic unit 144 to separately perform computation according to the first codeword $C_1$ and each decoding results $R_1$-$R_m$ to separately obtain a simulated error floor for each of the decoding results $R_1$-$R_m$ (step S34). Herein, because of the first noise and the second noise added in step S32 (especially the first noise added to the appearance position of the trapping set core), an error rate will be forcibly increased, so that the verification circuit 140 can get each simulated error floor more quickly. Furthermore, after obtaining each simulated error floor, the verification circuit 140 can use the arithmetic unit 144 to reversely derive out estimated error floors $E_1$-$E_m$ of the trapping-set-core information $I_1$-$I_m$ separately according to each simulated error floor and the ratio of the second value to the first value (step S35). In this way, the verification circuit 140 only needs to spend a short time to verify each simulated error floor with higher value, but can obtain a result equivalent to verifying the estimated error floors $E_1$-$E_m$ with lower values, thereby a lot of verification time can be saved.

In an embodiment of step S31, the codeword generation module 141 may include a message generator 1411 and an encoder 1412, and the message generator 1411 is coupled to the encoder 1412. Herein, the message generator 1411 can generate a message $M_1$ by random number generation. Furthermore, the encoder 1412 can use the LDPC code LDPC1 to encode the message $M_1$ to generate the first codeword $C_1$.

In an embodiment of step S34, the selection of the first value of the first noise by the noise generation module 142 may depend on the trapping set core in the each trapping-set-core information $I_1$-$I_m$, and the selection of the second value of the second noise may depend on an error rate that normally occurs. Herein, the noise generation module 142 sets the first value of the first noise so that a decoding error will definitely occur at the appearance position of the trapping set core, but the present invention is not limited thereto.

In an embodiment of step S35, the arithmetic unit 144 can derive the estimated error floors $E_1$-$E_m$ of the trapping-set-core information $I_1$-$I_m$ according to the following Equation 1. Equation 1: $Ex=Sx\times(y2/y1)^z$, wherein Ex is an estimated error floor, Sx is a simulated error floor, and x is a positive integer greater than 1 and less than or equal to m; and y1 is the first value, y2 us the second value, and z is the total number of crossed nodes to which first noise is added. For example, it is assumed that the appearance position of the trapping set core in the trapping-set-core information $I_1$ is at five crossed nodes, the noise generation module 142 may add first noise with 50% to the appearance position of the trapping set core in the LDPC code LDPC1 according to the trapping-set-core information $I_1$, and add second noise with 0.1% to the remaining positions. After that, the arithmetic unit 144 can obtain the estimated error floor is $10^{-3}$ according to the first codeword $C_1$ and the decoding result $R_1$, and then the arithmetic unit 144 can reversely derive out the estimated error floor $E_1$ is about $10^{-18}$ FER (or BER).

In some embodiments, the term "module" in the present invention, such as detection module 133, codeword generation module 141, noise generation module 142, etc., can be realized by ASIC (Application Specific Integrated Circuit). Furthermore, the processor 145 may be CPU (Central Processing Unit), MCU (Microcontroller), DSP (Digital Signal Processor), programmable controller, ASIC, PLD (Programmable Logic Device), or other similar circuit elements, but the present invention is not limited thereto.

In some embodiments, any one embodiment of apparatus 100 of the present invention can be integrated into a chip by a variety of integrated circuit manufacturing methods, but the present invention is not limited thereto.

As described above, any one embodiment of the present invention provides an apparatus and a generation method that use a plurality of trapping set cores stored in a database to quickly detect the trapping set core and its appearance position included in an LDPC code, and obtain simulated error floors by adding noise, such that the estimated error floors can be quickly reversely derive out according to the estimated error floors. Therefore, compared to traditional techniques, any one embodiment of an apparatus and a generation method of the present invention can provide an LDPC code with a required error floor faster.

The features of the embodiments described above will allow persons having ordinary skill in the art to clearly appreciate the form of the present specification. Persons having ordinary skill in the art will appreciate that the objectives and/or the advantages of the above embodiments can be accomplished in a way that is consistent with the above embodiments by designing or modifying other processes and structures based on the content of the present disclosure. Persons having ordinary skill in the art will also appreciate that equivalent constructions can be modified, substituted or retouched without departing from the scope and spirit of the present invention.

What is claimed is:

1. A method for generating an LDPC (low-density parity check) code with a required error floor, comprising:
   using a parity generation circuit to generate an LDPC code;
   using a detection circuit to detect the LDPC code according to a plurality of trapping set cores in a database and to generate at least one piece of trapping-set-core information for the LDPC code, wherein each trapping-set-core information comprises one of the trapping set cores, and an appearance number and an appearance position of it in the LDPC code, and wherein the trapping set core comprised in each trapping-set-core information are different from each other;
   using a verification circuit to perform an important sampling simulation according to the LDPC code and each trapping-set-core information separately to obtain an estimated error floor for each trapping-set-core information;
   using the verification circuit to separately compare each of the estimated error floors with an expected error floor; and
   when all of the estimated error floors are lower than or equal to the expected error floor, using the verification circuit to output the LDPC code.

2. The method as claimed in claim 1, wherein when the estimated error floor of any of the trapping-set-core information is greater than the expected error floor, the method returns to the step of using the parity generation circuit to generate the LDPC code.

3. The method as claimed in claim 1, wherein the step of using the verification circuit to perform the important sampling simulation according to the LDPC code and each trapping-set-core information separately to obtain the estimated error floor of each trapping-set-core information comprises:
   using a codeword generation module of the verification circuit to generate a first codeword according to LDPC code and a message;
   using a noise generation module of the verification circuit to add a first noise with a first value to the appearance position of the trapping set core in the LDPC code and to add a second noise with a second value to remaining positions in the LDPC code separately according to the trapping-set-core information, so as to separately generate a second codeword corresponding to the trapping-set-core information, wherein the first value is greater than the second value;

using a decoder of the verification circuit to separately decode each second codeword and separately generate a decoding result;

using an arithmetic unit to separately obtain a simulated error floor according to the first codeword and each decoding result; and using the arithmetic unit to separately obtain the estimated error floor of the trapping-set-core information according to the corresponding simulated error floor and a ratio of the second value to the first value.

4. The method as claimed in claim 1, wherein the step of using the detection circuit to detect the LDPC code according to the plurality of trapping set cores in the database and to generate the at least one piece of trapping-set-core information of the LDPC code comprises:

using a column selector of the detection circuit to select a first amount of columns in the LDPC code, and using a row selector of the detection circuit to select a second amount of rows in the LDPC code;

using a detection module to detect whether one of the trapping set cores appears among the first amount of columns and the second amount of rows that have been selected;

after finishing detection of the first amount of columns and the second amount of rows that have been selected, the method returns to the step of using the column selector of the detection circuit to select the first amount of columns in the LDPC code and using the row selector of the detection circuit to select the second amount of rows in the LDPC code; and after the detection module has scanned all combinations of the columns selected by the column selector and the rows selected by the row selector, separately generating the corresponding trapping-set-core information according to each trapping set core which appears in the LDPC code.

5. An apparatus for generating an LDPC code with a required error floor, comprising:

a database, configured to store a plurality of trapping set cores;

a parity generation circuit, configured to generate an LDPC code;

a detection circuit, configured to detect the LDPC code according to a plurality of trapping set cores and to generate at least one piece of trapping-set-core information of the LDPC code, wherein each trapping-set-core information comprises one of the trapping set cores, and an appearance number and an appearance position in the LDPC code of it, and wherein the trapping set core comprised in each trapping-set-core information are different from each other; and a verification circuit, configured to perform an important sampling simulation according to the LDPC code and each trapping-set-core information separately to obtain an estimated error floor for each trapping-set-core information, the verification circuit separately compares each of the estimated error floors with an expected error floor, and when all of the estimated error floors are lower than or equal to the expected error floor, the verification circuit outputs the LDPC code.

6. The apparatus as claimed in claim 5, wherein when the estimated error floor of any of the trapping-set-core information is greater than the expected error floor, the verification circuit further enables the parity generation circuit to generate another LDPC code.

7. The apparatus as claimed in claim 5, wherein the verification circuit comprises:

a codeword generation module, configured to generate a first codeword according to LDPC code and a message;

a noise generation module, configured to add a first noise with a first value to the appearance position of the trapping set core in the LDPC code and to add a second noise with a second value to remaining positions in the LDPC code separately according to each trapping-set-core information, so as to separately generate a second codeword corresponding to the trapping-set-core information, wherein the first value is greater than the second value;

a decoder, configured to separately decode each second codeword and separately generate a decoding result;

an arithmetic unit, configured to separately obtain a simulated error floor according to the first codeword and each decoding result, and to separately obtain the estimated error floor of the trapping-set-core information according to the corresponding simulated error floor and a ratio of the second value to the first value; and a processor, configured to separately compare each of the estimated error floors with the expected error floor, and when all of the estimated error floors are lower than or equal to the expected error floor, the processor outputs the LDPC code.

8. The apparatus as claimed in claim 7, wherein the codeword generation module comprises:

a message generator, configured to generate the message; and an encoder, configured generate the first codeword according to the LDPC code.

9. The apparatus as claimed in claim 5, wherein the detection circuit comprises:

a column selector, configured to select a first amount of columns in the LDPC code;

a row selector, configured to select a second amount of rows in the LDPC code;

a detection module, configured to detect whether one of the trapping set cores appears among the first amount of columns selected by the column selector and the second amount of rows selected by the row selector, after finishing detection of the first amount of columns and the second amount of rows that have been selected, the detection module enables the column selector and the row selector to select for detection again, and after scanning all combinations of the columns selected by the column selector and the rows selected by the row selector, the detection module separately generates the corresponding trapping-set-core information according to each trapping set core appears in the LDPC code.

* * * * *